(12) United States Patent
Olsen et al.

(10) Patent No.: US 8,846,509 B2
(45) Date of Patent: Sep. 30, 2014

(54) REMOTE RADICAL HYDRIDE DOPANT INCORPORATION FOR DELTA DOPING IN SILICON

(71) Applicant: Applied Materials, Inc., Santa Clara, CA (US)

(72) Inventors: Christopher S. Olsen, Fremont, CA (US); Johanes S. Swenberg, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 14 days.

(21) Appl. No.: 13/676,703

(22) Filed: Nov. 14, 2012

(65) Prior Publication Data

US 2013/0137249 A1  May 30, 2013

Related U.S. Application Data

(60) Provisional application No. 61/560,160, filed on Nov. 15, 2011.

(51) Int. Cl.
*H01L 21/425* (2006.01)

(52) U.S. Cl.
USPC .......................................... 438/516; 438/515

(58) Field of Classification Search
USPC .......................................... 438/516, 515, 514
See application file for complete search history.

(56) References Cited

U.S. PATENT DOCUMENTS

| | | | |
|---|---|---|---|
| 6,029,602 A | 2/2000 | Bhatnagar | |
| 6,263,830 B1 | 7/2001 | Kamarehi et al. | |
| 6,610,257 B2 | 8/2003 | Vane | |
| 7,344,927 B2 * | 3/2008 | Tsujimura et al. | 438/151 |
| 7,790,548 B2 * | 9/2010 | Song et al. | 438/259 |
| 2003/0232491 A1 * | 12/2003 | Yamaguchi | 438/591 |
| 2007/0117397 A1 * | 5/2007 | Fu et al. | 438/710 |
| 2007/0117414 A1 * | 5/2007 | Moffatt et al. | 438/795 |
| 2011/0217834 A1 * | 9/2011 | Ganguly et al. | 438/593 |
| 2012/0208371 A1 | 8/2012 | Rogers et al. | |

* cited by examiner

*Primary Examiner* — Reema Patel
(74) *Attorney, Agent, or Firm* — Patterson & Sheridan, LLP

(57) ABSTRACT

The present invention generally relates to methods of forming substrates using remote radical hydride doping. The methods generally include remotely activating a gas and introducing activated radicals of the gas into a chamber. The activated radicals may be activated hydride radicals of a gas such as diborane ($B_2H_6$), phosphine ($PH_3$), or arsine ($AsH_3$) which are utilized to incorporate an element such as boron, phosphorus, or arsenic into a substrate having a surface temperature between about 400 degrees Celsius and about 1000 degrees Celsius. Alternatively, the activated radicals may be activated radicals of an inert gas. The activated radicals of the inert gas are introduced into a chamber having a dopant-containing gas, such as diborane, phosphine, or arsine, therein. The activated radicals of the inert gas activate the dopant-gas and incorporate dopants into a heated substrate located within the chamber.

12 Claims, 4 Drawing Sheets

REMOTE RADICAL HYDRIDE DOPANT INCORPORATION FOR DELTA DOPING IN SILICON

CROSS-REFERENCE TO RELATED APPLICATIONS

This application claims benefit of U.S. Provisional Patent Application Ser. No. 61/560,160, filed Nov. 15, 2011, which is herein incorporated by reference.

BACKGROUND OF THE INVENTION

1. Field of the Invention

Embodiments of the invention generally relate to methods of doping substrates, such as semiconductor substrates.

2. Description of the Related Art

Junctions, such as p-n junctions, are commonly used in semiconductor devices such as diodes, transistors, solar cells, light-emitting diodes, and integrated circuits. One method of forming the junctions is doping, which introduces a dopant material into an intrinsic material. Typically, incorporation of boron, phosphorus, and arsenic or other dopants into a material, such as a semiconductor material, is performed by one of three ways.

In one manner, dopants such as boron, phosphorus, or arsenic may be introduced into a substrate by low temperature (e.g., less than 100 degrees Celsius) plasma ion implantation. The process is generally performed at low temperature due to the use of photoresists to restrict doping to desired areas of the substrate. The photoresists utilized during the plasma ion implantation process generally contain hydrocarbons, which degrade or "burn" at temperatures in excess of 150 degrees Celsius, making the photoresist difficult to remove after processing. In order to dope the substrate to the desired concentration, a significant substrate bias is employed to compensate for the reduced activity of the dopant species. However, the relatively large substrate bias, and the resulting ion acceleration energy (such as about 500 eV), creates interstitial defects in the substrate material. The interstitial defects promote dopant migration and diffusion (and therefore the depth of the dopant within the substrate, thus increasing the difficulty to form ultrashallow junctions (e.g., junctions have a depth of about 50 nanometers or less).

A second method of introducing dopants is beam line ion implantation. However, beam line ion implantation also utilizes ion implantation energies of about 500 eV, similarly resulting in interstitial defects which lead to excessive dopant migration and diffusion.

A third method of introducing dopants into a substrate is solid phase doping, in which dopants are incorporated into a substrate material via thermal migration. During a solid phase doping process, a substrate is heated to a surface temperature of about 1000 degrees Celsius or greater and exposed to a dopant, for example a dopant-containing gas. Due to the relatively high temperatures (e.g., greater than 1000 degrees Celsius), dopants diffuse form the dopant-containing gas into the substrate material. However, due to the relatively high temperatures needed to cause sufficient dopant diffusion into the substrate, and the diffusion coefficient at these high temperatures, the dopants diffuse significantly into the wafer. The significant diffusion of the dopants often results in the dopants diffusing excessively beyond the desired depth, thus increasing the difficulty to form ultrashallow junctions.

Therefore, there is a need for an improved method of forming ultrashallow junctions via doping.

SUMMARY OF THE INVENTION

The present invention generally relates to methods of forming substrates using remote radical hydride doping. The methods generally include remotely activating a gas and introducing activated radicals of the gas into a chamber. The activated radicals may be activated hydride radicals of a gas such as diborane ($B_2H_6$), phosphine ($PH_3$), or arsine ($AsH_3$) which are utilized to incorporate an element such as boron, phosphorus, or arsenic into a substrate having a surface temperature between about 400 degrees Celsius and about 1000 degrees Celsius. Alternatively, the activated radicals may be activated radicals of an inert gas. The activated radicals of the inert gas are introduced into a chamber having a dopant-containing gas, such as diborane, phosphine, or arsine, therein. The activated radicals of the inert gas activate the dopant-gas and incorporate dopants into a heated substrate located within the chamber.

In one embodiment, a method for doping a substrate comprises positioning a substrate having a hardmask thereon within a chamber. The temperature of the substrate is then elevated to range between about 400 degrees Celsius and about 1000 degrees Celsius, and a dopant-containing gas is introduced to a remote plasma generator. The remote plasma generator is in fluid communication with the chamber. A plasma containing ions and radicals of the dopant-containing gas is then generated within the remote plasma generator. The radicals of the plasma are then introduced into the chamber, and the substrate is doped by incorporating an element of the radicals into the substrate.

In another embodiment, a method for doping a substrate comprises positioning a substrate having a hardmask thereon within a chamber. The temperature of the substrate is then elevated to range between about 400 degrees Celsius and about 1000 degrees Celsius, and a dopant-containing gas is introduced into the chamber. An inert gas is introduced to a remote plasma generator in fluid communication with the chamber. A plasma of the inert gas containing ions and radicals is then generated within the remote plasma generator. The radicals of the inert gas are then introduced into the chamber to form radicals of the dopant-containing gas, and the substrate is doped by incorporating an element of the radicals of the dopant-containing gas into the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present invention generally relates to methods of forming substrates using remote radical hydride doping. The methods generally include remotely activating a gas and introducing activated radicals of the gas into a chamber. The activated radicals may be activated hydride radicals of a gas such as diborane ($B_2H_6$), phosphine ($PH_3$), or arsine ($AsH_3$) which are utilized to incorporate an element such as boron, phosphorus, or arsenic into a substrate having a surface temperature between about 400 degrees Celsius and about 1000 degrees Celsius. Alternatively, the activated radicals may be activated radicals of an inert gas. The activated radicals of the inert gas are introduced into a chamber having a dopant-containing gas, such as diborane, phosphine, or arsine, therein. The activated radicals of the inert gas activate the dopant-gas and incorporate dopants into a heated substrate located within the chamber.

Figure 1:
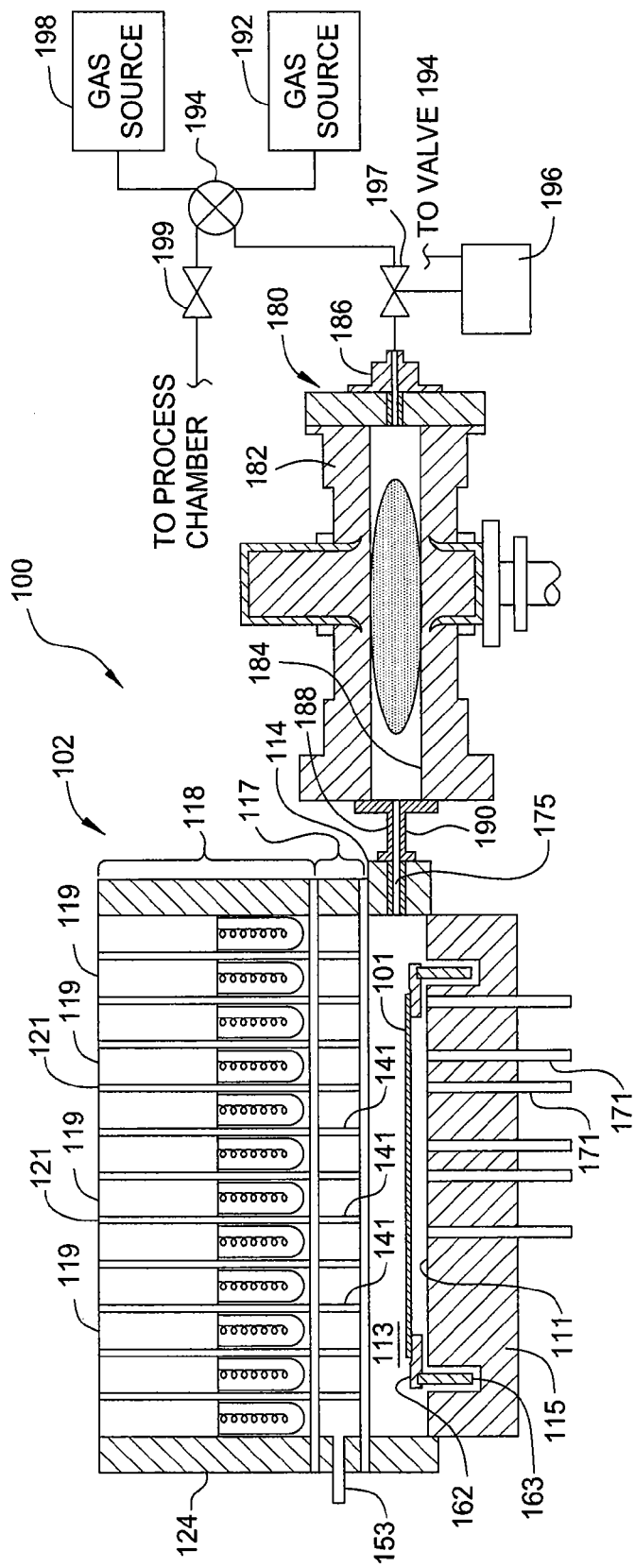
FIG. 1 is a schematic sectional view of a remote plasma system according to one embodiment of the invention.

FIG. 1 is a schematic sectional view of a remote plasma system 100 according to one embodiment of the invention. The remote plasma system 100 may be used to incorporate dopants into a substrate 101, such as a silicon wafer, to form ultrashallow junctions within the substrate 101. The remote plasma system 100 includes a processing chamber 102 such as a rapid thermal processing (RTP) apparatus. The processing chamber 102 may be a Centura® RTP chamber commercially available from Applied Materials, Inc., located in Santa Clara, Calif. Other types of thermal reactors may be substituted for the processing chamber 102 such as, for example, RPN, RPO, Vantage RadiancePlus™ RTP, Vantage RadOX™ RTP, Radiance® RTP, or other similar chambers/reactors available from Applied Materials Inc. of Santa Clara, Calif. It is contemplated that chambers available from other manufacturers may also benefit from embodiments of the invention.

A remote plasma generator 180 is coupled to the processing chamber 102 and is used to remotely provide radicals of a plasma to the processing chamber 102. The processing chamber 102 generally includes a processing region 113 enclosed by a side wall 114 and a bottom wall 115. The upper portion of side wall 114 may be sealed to a window assembly 117 by "O" rings. A radiant energy light pipe assembly 118 (enclosed by an upper side wall 124) is positioned over and coupled to the window assembly 117. The light pipe assembly 118 may include a plurality of tungsten halogen lamps 119 each mounted into light pipes 121 and positioned to adequately cover the entire surface area of the substrate 101. The window assembly 117 may include a plurality of short light pipes 141. A vacuum can be produced in the plurality of light pipes 141 by pumping through a tube 153 connected to one of the light pipes 141 which is in turn connected to the rest of the light pipes 141.

The substrate 101 is supported by a support ring 162 within the processing region 113. The support ring 162 is mounted on a rotatable cylinder 163. By rotating the cylinder 163, the support ring 162 and the substrate 101 are rotated during processing. The bottom wall 115 of the processing chamber 102 may be coated or provided with a reflector 111 for reflecting energy onto the backside of the substrate 101. The processing chamber 102 may include a plurality of fiber optic probes 171 positioned through the bottom wall 115 of the processing chamber 102 to detect the temperature of the substrate 101.

The remote plasma generator 180 generally includes a body 182 surrounding a tube 184 where a plasma of ions, radicals, and electrons is generated. The tube 184 may be made of quartz or sapphire. The tube 184 preferably does not have any electrical bias present that might attract charged particles, e.g., ions. A gas inlet 186 is disposed at one end of the body 182 opposite a gas outlet 188. The gas outlet 188 is in fluid communication with the processing chamber 102 through a delivery pipe 190 such that radicals of the plasma generated within the tube 184 are supplied to the processing region 113 of the processing chamber 102. The gas outlet 188 may have a diameter larger than gas inlet 186 to allow the excited radicals to be efficiently discharged at a desired flow rate and to minimize the contact between the radicals and the tube 184. If desired, a separate orifice may be inserted into tube 184 at the gas outlet 188 to reduce the tube's inner diameter. The diameter of the gas outlet 188 (or orifice, if used) can be selected to optimize the pressure differential between the processing region 113 and the remote plasma generator 180 for process efficiency.

A gas source 192, which for example may provide a dopant-containing gas such as diborane, phosphine, or arsine, is coupled to a gas inlet 286 via a first input of a three-way valve 194 and a valve 197 used to control the flow rate of gas released from the gas source 192. A second input of the three-way valve 194 may be coupled to another process gas source 198 including, but not limited to, oxygen-containing gas, silicon-containing gas, or an inert gas such as argon, helium, or another noble gas. It is contemplated that nitrogen ($N_2$) may also be utilized in some embodiments. A flow controller 196 is connected to the three-way valve 294 to switch the valve between its different positions, depending upon which process is to be carried out. The flow controller 296 also functions in a similar fashion to control the three-way valve 194 to provide an appropriate process gas flow from gas source 198 to the processing region 113 of the processing chamber 102 through valve 199. It is contemplated that a process gas may be provided to the processing region 113 of the processing chamber 102 by an independent source rather than through the three-way valve 194.

The remote plasma generator 180 may be coupled to an energy source (not shown), such as a microwave energy source, which provides excitation energy to the remote plasma generator 180 to excite the process gas traveling from the gas source 192 into a plasma which includes radicals, ions, and electrons. By locating the remote plasma generator 180 remotely from the processing region 113 of the processing chamber 102, a plasma source can be selectively tuned to control the composition of the plasma to which the substrate 101 is exposed. Desirably, the composition of the plasma entering the processing chamber 102 is predominantly radicals, rather than ions, thus reducing undesired reactions with substrate. Radicals introduced to the processing chamber 102 according to embodiments of the invention generally do not possess sufficient energy to break silicon-oxide bonds common on semiconductor substrates. It has been observed that ion collisions are promoted by using a delivery pipe 190 such that all or the majority of ions generated by the excitation of the process gas become charge neutral before reaching the processing region 113, for example, by recombining with electrons present within the plasma. In other words, the composition of the plasma that is supplied to the inlet port 175 of the processing chamber 102 is predominantly radicals.

The invention as described herein contemplates that substantially all ions present in the plasma at the plasma generation are eliminated prior to coming in to contact with the surface of the substrate 101 during processing. One way positively charged ions are eliminated is by combining with electrons (also present in the plasma at the plasma generation) to return to a non-ionic or charge neutral state. A plasma may be substantially free of the majority of the ions by separating the plasma generation source from the substrate location, e.g., the reaction site, by a distance longer than the lifetime of the ions at a given plasma discharge rate. Thus, elimination of ions can be facilitated by increasing the length or varying the geometry of the delivery pipe 190. In this manner, the radicals survive the travel distance to the substrate, but ions do not and instead lose their ionic character and become charge neutral.

In certain embodiments, various ion filters, such as electrostatic filters operated at a bias of, for example, about 200V (RF or DC), wire or mesh filters, or magnetic filters, any of which may have a dielectric coating, may be used between the remote plasma generator 180 and the processing chamber 102. In other embodiments, residence time in the remote plasma generator 180 may be modulated using gas flow of reactive species, such as a dopant-containing gas, or gas flow of non-reactive species such, as argon or helium. In some embodiments, radical half-life may be extended by using an ion filter with low pressure (e.g., less than about 20 Torr) plasma generation. Low pressure operation may be facilitated by integrating a processing chamber, such as the processing chamber 102, with a remote plasma generator 180 without using an O-ring to seal the pathway between the two chambers. Uniformity of radical flow into a processing chamber from the remote plasma generator 180 may be improved using a shaped connector to provide intimate control of flow patterns.

In another embodiment, it is contemplated that one or more of components within with the processing chamber 102 may be formed form quartz. In such an embodiment, dopants may react with or deposit on the quartz components, such as a quartz window. Therefore, it would be desirable to clean the surfaces of the quartz components with a cleaning gas, such as Cl2 or HCl.

Figure 2:
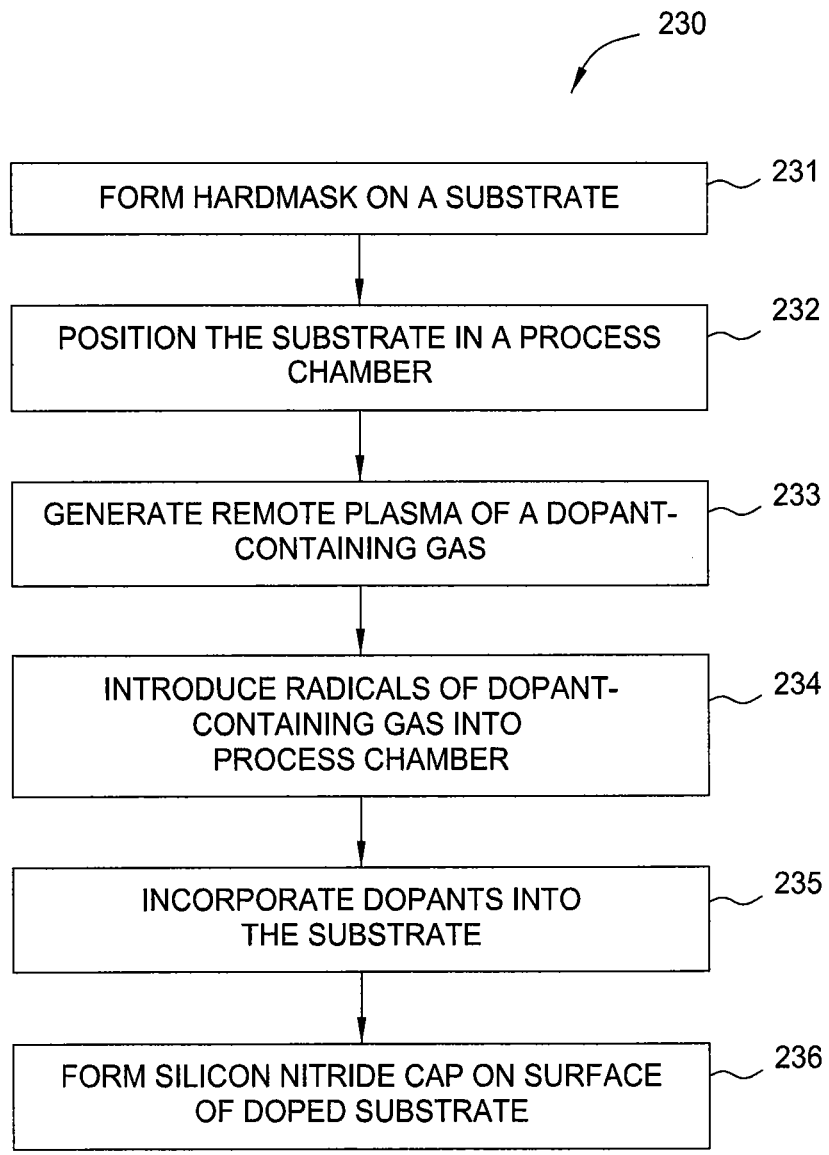
FIG. 2 is a flow diagram illustrating a method of doping a substrate according to one embodiment of the invention.

FIG. 2 is a flow diagram 230 illustrating a method of doping a substrate according to one embodiment of the invention. The method includes doping a substrate having an elevated temperature using remotely-activated radicals. Flow diagram 230 begins at operation 231, in which a hardmask is disposed over the surface of a substrate, such as a silicon wafer. The hardmask, which may be formed from silicon nitride or silicon dioxide, is disposed over the surface of the substrate and then patterned using a photoresist which is subsequently removed. The hardmask disposed over the substrate has openings therethrough which define regions of the substrate which are to be implanted with a dopant in a subsequent doping process (see operation 235).

Hardmasks are preferable to photoresists, particularly for doping or implanting processes occurring in excess of 100 degrees Celsius, due to the stability of hardmasks at temperatures in excess of 100 degrees Celsius. The hardmask disposed on the substrate in operation 231 is generally deposited to a thickness of about 20-30 angstroms, unlike typical masks which must be deposited to significantly greater thicknesses (for example, 50 nanometers or more) during plasma doping processes. The hardmasks of the present invention can be deposited having a relatively smaller thickness because the activated species of the present invention are not accelerated using a biased substrate support, or are accelerated using relatively small acceleration energies, such as about 50 eV. Thus, the hardmask of the present invention need not have a thickness sufficient to withstand bombardment of the activated species, because bombardment of species is minimal. Acceleration energies in excess of about 50 eV are not necessary to cause the desired level of doping, because doping is facilitated by the increased temperature of the substrate during doping, as explained in further detail with respect to operation 235. The relatively smaller thickness of the hardmasks increases process throughput by reducing the amount of time required to apply and remove the hardmasks, and also reduces the cost of consumable materials (e.g., the hardmask material), since less material is applied to the surface of the substrate.

Subsequent to placement of the hardmask on the substrate, the substrate is positioned within a processing chamber, in operation 232. The surface temperature of the substrate is then elevated to a processing temperature, such as about 400 degrees Celsius to about 1000 degrees Celsius, for example, about 400 degrees Celsius to about 700 degrees Celsius. Generally, the processing temperature of the substrate is sufficient to facilitate incorporate of dopants into the substrate at a desired depth and concentration while mitigating or eliminating interstitial defects.

In operation 233, a dopant-containing gas, such as diborane, phosphine, or arsine, is remotely activated in a remote plasma generator using a microwave energy source. It is contemplated that one or more inert gases, such as argon or helium, may also be introduced to the remote plasma generator during activation. Activation of the dopant-containing gas results in the formation of ions, electrons, and radicals, such as hydride radicals. The dopant-containing gas is activated into a plasma using about 1 kilowatt (kW) to about 3 kW of power. The application of about 1 kW to about 3 kW of power minimizes dissociation of dopant-containing gas, thus reducing the number of ions generated in the remote plasma generator. Additionally, a high radical density versus ion density may be further facilitated by maintaining the pressure within the remote plasma generator at a pressure between about 1 Torr and about 20 Torr, such as about 1 Torr to about 5 Torr.

In operation 234, the radicals of the dopant-containing gas, such as hydride radicals, generated in operation 233 are introduced into the process chamber containing the substrate with the hardmask thereon. Radicals may be provided to the process chamber at flow rate of about 1 SLM to about 20 SLM, such as about 5 SLM to about 10 SLM. As discussed above, preferably the introduction of ions into the process chamber is minimized. The elevated surface temperature of the substrate combined with the activated radicals of the dopant-containing gas facilitates incorporation of a dopant, such as boron, phosphorus, or arsenic, into exposed surfaces of the substrate in operation 235. It is to be understood that the depth and concentration of the dopants may be controlled by varying the exposure time of the substrates and amount or radicals provided to the process chamber, as well as the temperature of the substrate. By maintaining the surface temperature of the substrate between about 400 degrees Celsius about 1000 degrees Celsius, such as about 400 degrees Celsius to about 700 degrees Celsius during dopant incorporation, the dopants are incorporated without causing interstitial defects in the substrate material, thus facilitating the formation of ultrashallow junctions. Additionally, since dopants are incorporated from the activated radicals into the substrate without the use of high implantation energies (e.g., greater than about 500 eV), interstitial defects are further mitigated.

In operation 236, an optional silicon nitride cap may be formed on the surface of the doped substrate. The silicon nitride cap may be formed by providing remotely activated nitrogen (N₂) radicals from the remote plasma generator to the process chamber. The temperature of the substrate may be maintained at a temperature between about 300 degrees Celsius and about 1200 degrees Celsius, such as about 800 degrees Celsius and about 1000 degrees Celsius while introducing the activated nitrogen radicals into the process chamber. The activated nitrogen radicals selectively react with the exposed silicon surfaces of the substrate (for example, when utilizing a silicon wafer as a substrate) to form silicon nitride thereon. The activated nitrogen radicals may be provided to the process chamber at a similar pressure and flow rate as the dopant-containing gas. The temperature of the substrate is generally increased for the silicon nitride cap formation process as compared to the doping process in order to facilitate reaction of the nitrogen radicals with exposed silicon surfaces of the substrate.

Additionally, it is contemplated that the silicon nitride cap may also be doped with the same dopant as was incorporated into the substrate, and thus, may function as a surface diffusion layer to reduce diffusion of dopants from the surface of the substrate. When forming a doped silicon nitride cap, a desired dopant-containing gas may be provided to the remote plasma generator concurrently with nitrogen gas. The nitrogen gas and the dopant-containing gas can then be activated simultaneously, and provided to the process chamber to form a doped silicon nitride layer on the surface of the doped substrate.

Figure 3:
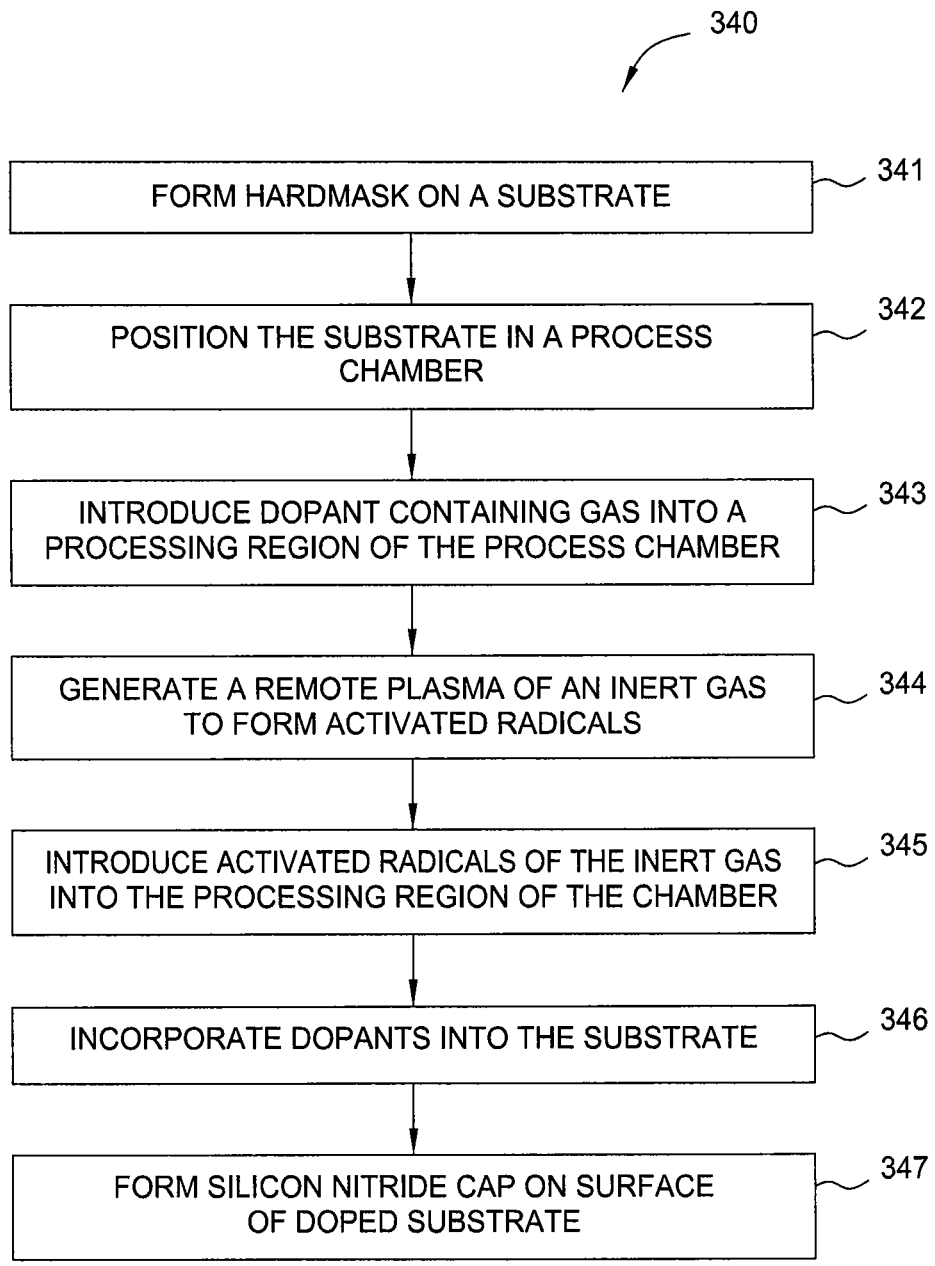
FIG. 3 is a flow diagram illustrating a method of doping a substrate according to another embodiment of the invention.

FIG. 3 is a flow diagram 340 illustrating a method of doping a substrate according to another embodiment of the invention. The method includes doping a substrate having an elevated temperature using remotely-activated radicals. Flow diagram 340 begins at operation 341, in which a hardmask is formed on a substrate. The substrate, having the hardmask thereon, is then positioned in a process chamber. Operations 341 and 342 are similar to operations 231 and 232 explained with reference to FIG. 2.

In operation 343, a dopant-containing gas, such as diborane, phosphine, or arsine, is introduced to the processing region of the processing chamber. In the embodiment of FIG. 3, the dopant-containing gas is not activated when introduced into the processing chamber. Thus, minimal doping of the substrate occurs in operation 343 since there are no radicals present within the processing region of the processing chamber.

In operation 344, an inert gas, such as argon, helium, or another noble gas, is introduced to a remote plasma generator and ignited into a plasma. It is contemplated that nitrogen gas may also be used in some embodiments. The inert gas, at a pressure between about 1 Torr about and 20 Torr, is ignited into a plasma using a microwave energy source providing about 1 kW to about 3 kW of energy. In operation 345, activated radicals of the inert gas are introduced into the process chamber from the remote plasma generator. As explained with reference to FIG. 1, desirably the process chamber and the remote plasma generator are configured such that substantially only radicals, and not ions, are provided to the processing chamber. The activated radicals or the inert gas activate the dopant-containing gas to form radicals, such as hydride radicals, without dissociating the dopant gas. Thus, an activated dopant gas containing radicals and substantially free of ions is generated within the processing region of the processing chamber. Because the dopant-containing gas is activated in the process chamber, there is a reduced likelihood of dissociating the dopant-containing gas, as might happen, for example, within the remote plasma generator. In operation 346, dopants from the activated dopant-containing gas are incorporated into the substrate, similar to operation 235 described. In operation 347, a silicon nitride cap may optionally be formed on the surface of the doped substrate, as similarly described in operation 236.

Figure 4:
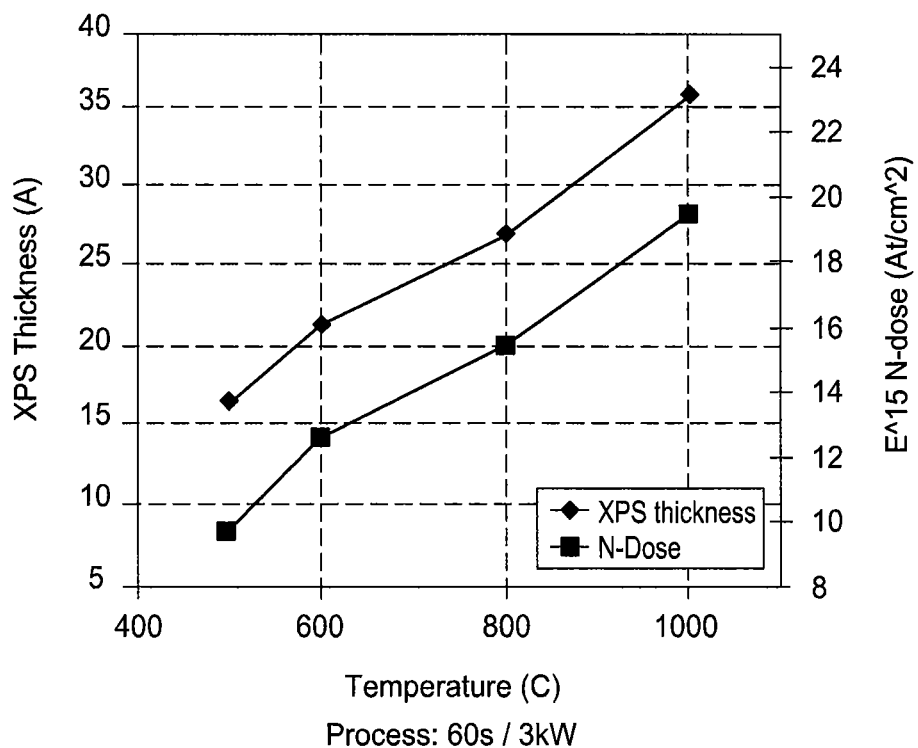
FIG. 4 is a graph illustrating the relationship between dopant concentration and depth versus substrate temperature.

FIG. 4 is a graph illustrating the relationship between dopant concentration and depth versus substrate temperature. As shown in FIG. 4, both the concentration of the dopant (nitrogen in the shown example), as well as the dopant depth increase with increasing temperature. Thus, by maintaining a lower substrate temperature, such as about 400 degrees Celsius to about 1000 degrees Celsius, and by utilizing activated dopant radicals, dopants can be incorporated into a substrate at a depth less than about 37 angstroms, thus facilitating the formation of ultrashallow junctions.

Benefits of the present invention include consistent formation of ultrashallow junctions having desired depth and concentrations. The utilization of activated radicals in combination with moderately-elevated temperatures (e.g., temperatures between about 400 degrees Celsius and 100 degrees Celsius), incorporates dopants into a substrate surface to a desired depth while minimizing or eliminating interstitial defects and excessive dopant diffusion and migration, thus facilitating the formation of ultrashallow junctions.

While the foregoing is directed to embodiments of the present invention, other and further embodiments of the invention may be devised without departing from the basic scope thereof, and the scope thereof is determined by the claims that follow.

We claim:

1. A method for doping a substrate, comprising:
positioning a substrate having a hardmask thereon within a chamber;
elevating the temperature of the substrate to range between about 400 degrees Celsius and about 1000 degrees Celsius;
introducing a dopant-containing gas to a remote plasma generator, the remote plasma generator in fluid communication with the chamber;
generating a plasma of the dopant-containing gas within the remote plasma generator, the plasma containing ions and radicals;
flowing the dopant-containing gas from the remote plasma generator to the chamber, wherein during the flowing a majority of the ions are filtered or become charge neutral;
introducing the dopant-containing gas into the chamber; and
doping the substrate by incorporating an element of the radicals into the substrate.

2. The method of claim 1, wherein the radicals are radicals of a hydride.

3. The method of claim 2, wherein the radicals are radicals of diborane, phosphine, or arsine.

4. The method of claim 1, further comprising forming a silicon nitride cap on a surface of the substrate.

5. The method of claim 1, wherein generating a plasma of the dopant-containing gas comprises applying microwave energy to the remote plasma generator.

6. The method of claim 1, wherein an electrostatic filter is positioned between the chamber and the remote plasma generator to filter the ions.

7. The method of claim 1, wherein a wire or mesh filter is positioned between the chamber and the remote plasma generator to filter the ions.

8. The method of claim 7, wherein the wire or mesh filter includes a dielectric coating.

9. The method of claim 1, wherein a magnetic filter is positioned between the chamber and the remote plasma generator to filter the ions.

10. The method of claim 9, wherein the magnetic filter includes a dielectric coating.

11. The method of claim 1, wherein during the flowing the dopant-containing gas to the chamber, all of the ions are filtered or become charge neutral.

12. A method for doping a substrate, comprising:
- positioning a substrate having a hardmask thereon within a chamber;
- elevating the temperature of the substrate to range between about 400 degrees Celsius and about 1000 degrees Celsius;
- introducing a gas to a remote plasma generator in fluid communication with the chamber;
- generating a plasma of the gas within the remote plasma generator, the plasma containing ions and radicals;
- flowing the gas to the chamber, wherein during the flowing a majority of the ions are filtered or become charge neutral;
- introducing the radicals of the gas into the chamber; and
- doping the substrate with an element of the radicals.

* * * * *